(12) United States Patent
Forrest et al.

(10) Patent No.: US 10,069,033 B2
(45) Date of Patent: Sep. 4, 2018

(54) INTEGRATION OF EPITAXIAL LIFT-OFF SOLAR CELLS WITH MINI-PARABOLIC CONCENTRATOR ARRAYS VIA PRINTING METHOD

(71) Applicant: The Regents of the University of Michigan, Ann Arbor, MI (US)

(72) Inventors: Stephen R. Forrest, Ann Arbor, MI (US); Kyusang Lee, Ann Arbor, MI (US); Dejiu Fan, Ann Arbor, MI (US); Jeramy Zimmerman, Golden, CO (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/109,845

(22) PCT Filed: Jan. 15, 2015

(86) PCT No.: PCT/US2015/011601
§ 371 (c)(1),
(2) Date: Jul. 6, 2016

(87) PCT Pub. No.: WO2015/156874
PCT Pub. Date: Oct. 15, 2015

(65) Prior Publication Data
US 2016/0329457 A1 Nov. 10, 2016

Related U.S. Application Data

(60) Provisional application No. 61/927,932, filed on Jan. 15, 2014, provisional application No. 61/947,120, filed on Mar. 3, 2014.

(51) Int. Cl.
*H01L 31/18* (2006.01)
*H01L 31/0304* (2006.01)
(Continued)

(52) U.S. Cl.
CPC .... *H01L 31/1896* (2013.01); *H01L 31/03046* (2013.01); *H01L 31/0547* (2014.12);
(Continued)

(58) Field of Classification Search
None
See application file for complete search history.

(56) References Cited

U.S. PATENT DOCUMENTS

| 4,440,153 A | 4/1984 | Melchior |
| 2004/0121568 A1 | 6/2004 | Kim et al. |

(Continued)

FOREIGN PATENT DOCUMENTS

EP  2 521 189  11/2012

OTHER PUBLICATIONS

Horng et al., "Thin Film Solar Cells Fabricated Using Cross-Shaped Pattern Epilayer Lift-Off Technology for Substrate Recycling Applications," IEEE Transactions on Electron Devices, vol. 59, No. 3, Mar. 2012, pp. 666-672.

(Continued)

*Primary Examiner* — Angel Roman
(74) *Attorney, Agent, or Firm* — Finnegan, Henderson, Farabow, Garrett & Dunner, LLP

(57) ABSTRACT

There is disclosed a method of preparing a photovoltaic device. In particular, the method comprises integrating epitaxial lift-off solar cells with mini-parabolic concentrator arrays via a printing method. Thus, there is disclosed a method comprising providing a growth substrate; depositing at least one protection layer on the growth substrate; depositing at least one sacrificial layer on the protection layer; depositing at least one photoactive cell on the sacrificial layer; etching a pattern of at least two parallel trenches that extend from the at least one photoactive cell to the sacrificial layer; depositing a metal on the at least one photoactive cell;

(Continued)

bonding said metal to a host substrate; and removing the sacrificial layer with one or more etch steps. The host substrate can be a siloxane, which when rolled, can form a stamp used to integrate solar cells into concentrator arrays. There are also disclosed a method of making a growth substrate and the growth substrate made therefrom.

49 Claims, 9 Drawing Sheets

(51) Int. Cl.
*H01L 31/0687* (2012.01)
*H01L 31/0693* (2012.01)
*H01L 31/054* (2014.01)
*H01L 31/0352* (2006.01)

(52) U.S. Cl.
CPC ...... *H01L 31/0687* (2013.01); *H01L 31/0693* (2013.01); *H01L 31/1892* (2013.01); *H01L 31/035281* (2013.01); *Y02E 10/52* (2013.01); *Y02E 10/544* (2013.01); *Y02P 70/521* (2015.11)

(56) References Cited

U.S. PATENT DOCUMENTS

| | | | |
|---|---|---|---|
| 2010/0317132 A1* | 12/2010 | Rogers | H01L 25/0753 438/27 |
| 2011/0240104 A1* | 10/2011 | Lee | H01L 31/02167 136/252 |
| 2011/0266561 A1 | 11/2011 | Rogers et al. | |
| 2013/0043214 A1 | 2/2013 | Forrest et al. | |
| 2013/0228221 A1* | 9/2013 | Moslehi | H01L 31/02244 136/256 |
| 2014/0338726 A1* | 11/2014 | Nobori | H01L 31/052 136/246 |

OTHER PUBLICATIONS

International Search Report & Written Opinion, PCT/US2015/011601, dated Oct. 19, 2015.

* cited by examiner

INTEGRATION OF EPITAXIAL LIFT-OFF SOLAR CELLS WITH MINI-PARABOLIC CONCENTRATOR ARRAYS VIA PRINTING METHOD

This application claims priority to U.S. Provisional Application No. 61/927,932, filed on Jan. 15, 2014, and 61/947,120, filed on Mar. 3, 2014, both of which are incorporated herein by reference in their entirety.

STATEMENT REGARDING FEDERALLY SPONSORED RESEARCH

This invention was made with U.S. Government support under Contract No. W911 NF-08-2-0004 awarded by the U.S. Army Research Laboratory. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure generally relates to methods and growth structures for making thin-film electronic and optoelectronic devices, such as flexible photovoltaic devices, using epitaxial lift-off (ELO). In particular, the disclosure relates to thin-film ELO cells bonded onto flexible substrates that provide a unique opportunity to integrate the solar collector with the thin-film cell.

Epitaxial lift off (ELO) has yielded thin single crystalline GaAs solar cells with record efficiencies of >28%. While impressive, the process of using chemical etching of a "sacrificial layer" between the cell active layers and the substrate in ELO requires wafer polishing of the parent wafer to ready it once more for epitaxial growth of another solar cell active region. Unfortunately, wafer polishing removes significant amounts of wafer material while inflicting additional damage to the wafer after only a few cycles, leading to prohibitively high production costs.

Thin-film technologies, such as single-crystalline semiconductor-based devices, are desirable in the field of electronics due to their flexibility, light weight, and high performance characteristics. ELO is a technology in which a thin-film device region may be "lifted off" of a growth substrate or wafer and transferred to a host substrate. The device region is separated from the wafer by selectively etching a sacrificial layer. A key advantage of the ELO process is the potential for wafer reuse following lift-off of the device region, which can greatly reduce manufacturing costs by minimizing the consumption of expensive wafers.

Conventional ELO processes, however, result in significant wafer surface roughening and accumulation of contaminants. To eliminate these defects in preparation for subsequent epitaxial growth, a polishing etch process is typically used. Generally, however, this process does not provide a high quality regrowth interface, and thus device layers grown on a chemically polished surface after ELO lead to subsequently fabricated devices with dramatically reduced performance. Bauhuis, G. J. et al., "Wafer reuse for repeated growth of III-V solar cells," *Prof. Photovolt.* 18, 155-159 (2010). Chemo-mechanical wafer repolishing is used to solve this problem, but such process consumes tens of microns of material from the top surface of the wafer, thereby limiting the potential number of wafer reuses.

As a result of the foregoing, there is a need for an improved ELO process that relies on sacrificial layers to protect the growth substrate and allow for reuse. There is also a need for an improved process that would allow one to integrate solar collectors within the thin-film cells without introducing significant additional costs.

The inventors have discovered a non-destructive method for performing an epitaxial lift-off. Thus, there is disclosed a method comprising providing a growth substrate; depositing at least one protection layer on the growth substrate; depositing at least one sacrificial layer on the protection layer; depositing a photoactive cell on the sacrificial layer; a metal mask on the at least one photoactive cell; performing a first etch step through said metal mask to form a pattern in the photoactive cell, wherein said pattern extends to the sacrificial layer; and removing the sacrificial layer with one or more second etch steps.

The inventors have also discovered an improved growth structure for epitaxial lift-off. Thus, there is disclosed a growth structure comprising a growth substrate; at least one protection layer on the growth substrate; at least one sacrificial layer on the protection layer; at least one photoactive cell on the sacrificial layer; and at least one pattern that has been etched from photoactive cell to the sacrificial layer, wherein the etched pattern comprises two or more parallel trenches that have been etched in the at least one photoactive cell.

The inventors have also discovered a method of preparing a photovoltaic device that takes advantage of the improved non-destructive ELO method, and resulting growth structure. In particular, there is disclosed a method that comprises integrating epitaxial lift-off solar cells with mini-parabolic concentrator arrays via a printing method. The disclosed method comprising providing a growth substrate; depositing at least one protection layer on the growth substrate; depositing at least one sacrificial layer on the protection layer; depositing at least one photoactive cell on the sacrificial layer; etching a pattern of at least two parallel trenches that extend from the at least one photoactive cell to the sacrificial layer; depositing a metal on the at least one photoactive cell; bonding the metal to a host substrate; and removing the sacrificial layer with one or more etch steps. This method provides a host substrate, such as an elastomeric material, which can be rolled into a stamp and used in a printing method to integrate solar cells, which have been grown on the growth substrate, into mini concentrator arrays.

Aside from the subject matter discussed above, the present disclosure includes a number of other exemplary features such as those explained hereinafter. It is to be understood that both the foregoing description and the following description are exemplary only.

BRIEF DESCRIPTION OF THE DRAWINGS

The accompanying figures are incorporated in, and constitute a part of this specification.

DETAILED DESCRIPTION

Definitions

Figure 1:
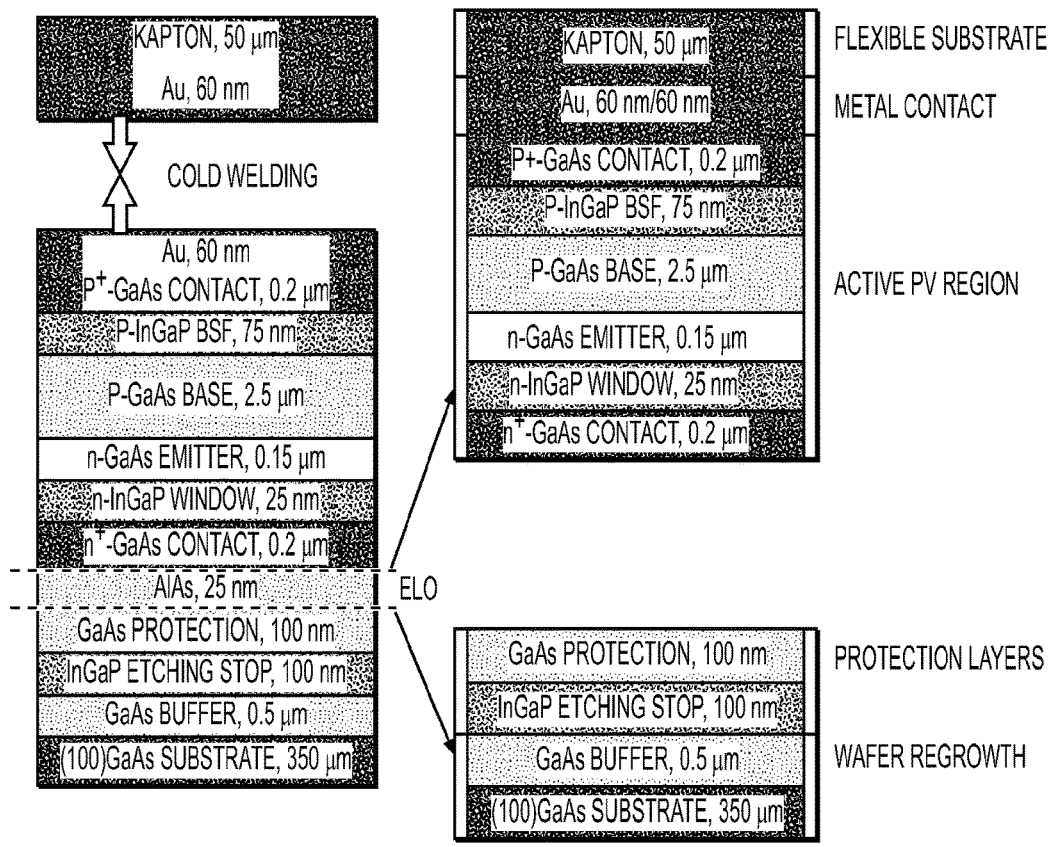
FIG. 1 is a schematic illustration of the generalized wafer structure used in non-destructive epitaxial lift-off (ND-ELO).

As used herein, the term "III-V material," may be used to refer to compound crystals containing elements from group IIIA and group VA of the periodic table. More specifically, the term "III-V material" may be used herein to refer to compounds which are combinations of the group of Gallium (Ga), Indium (In) and Aluminum (Al), and the group of Arsenic (As), Phosphorous (P), Nitrogen (N), and Antimony (Sb).

It should be noted that the III-V compounds herein are named in an abbreviated format. A two component material is considered to be in approximately a 1:1 molar ratio of group III:V compounds. In a three or more component system (e.g. InGaAlAsP), the sum of the group III species (i.e. In, Ga, and Al) is approximately 1 and the sum of the group V components (i.e. As, and P) is approximately 1, and thus the ratio of group III to group V is approximately unity.

Names of III-V compounds are assumed to be in the stoichiometric ratio needed to achieve lattice matching or lattice mismatching (strain), as inferred from the surrounding text. Additionally, names can be transposed to some degree. For example, AlGaAs and GaAlAs are the same material.

As used and depicted herein, a "layer" refers to a member or component of a device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

When a first layer is described as disposed or deposited "over" or "above" a second layer, the first layer is positioned further away from the substrate than the second layer. The first layer may be disposed directly on the second layer, but unless it is specified that the first layer is disposed or deposited "on" or "in physical contact with" the second layer, there may be other layers between the first layer and the second layer. For example, an epilayer may be described as disposed "over" or "above" a sacrificial layer, even though there may be various layers in between. Similarly, a protection layer may be described as disposed "over" or "above" a growth substrate, even though there may be various layers in between. Similarly, when a first layer is described as disposed or deposited "between" a second layer and a third layer, there may be other layers between the first layer and the second layer, and/or the first layer and the third layer, unless it is specified that the first layer is disposed or deposited "on" or "in physical contact with" the second and/or third layers.

As used herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

As used herein, the terms "wafer" and "growth substrate" can be used interchangeably.

As used herein the term "etchant selectivity" refers to the rate at which a particular etchant removes a particular material when compared to the rate of etching of another material. Etchant selectivity of X and Y is quantified as the ratio between the etching rate of X to the etching rate of Y for a particular etchant. Accordingly, "highly selective," as used herein, refers to instances where one material is etched rapidly while the other is etched very slowly or not etched at all, such as greater than 10:1, or 100:1, or 1000:1, 10,000:1 or greater.

Compared to elemental semiconductors such as Si or Ge, compound semiconductors often have superior properties useful in high efficiency solar cells. However, wafers on which active device regions are grown are prohibitively costly (e.g. GaAs wafers cost ~$20 k/m2), limiting their use for practical solar cells. As a result Epitaxial Lift-Off (ELO), whereby III-V semiconductor solar cells are removed from the substrate by selectively etching away an AlAs "sacrificial layer" between the wafer and the cell epi (also referred to as photoactive cell), are described herein to reduce costs by allowing for wafer re-use.

The non-destructive substrate reuse method without performance degradation described herein provides the potential for dramatic production cost reduction. In addition, the disclosed method extends the application of high performance group III-V optoelectronic devices by moving from bulky, two dimensional substrate-based platforms to conformal, flexible and light weight thin-film devices. Moreover, direct integration of thin-film solar cells with low cost concentrators, such as plastic parabolic concentrators, can further reduce the cost for solar to electrical energy conversion.

Thin-Film Inorganic Solar Cell Fabrication

Applicants disclose herein a completely non-destructive ELO (ND-ELO) process that eliminates wafer damage by employing surface protecting layers interposed between the wafer and the epitaxy. The Applicants have discovered that when these surface protecting layers are removed, all the inherent surface damage can also be removed. The process uses chemically selective etchants combined with a plasma process.

According to one aspect described herein, the epitaxial structure consists of multilayer structure, including sequential protection, sacrificial and active device layers. The protection layers comprise protection and buffer layers, which are generally lattice matched layers having a thickness ranging from 5 to 200 nm, such as 10 to 150 nm, or even 20 to 100 nm. These layers are generally grown by gas source, such as gas source molecular beam epitaxy (GSMBE). Other suitable deposition techniques for preparing the growth structure include, but are not limited to, metallo-organic chemical vapor deposition (MOCVD), hydride vapor phase epitaxy (HVPE), solid source molecular beam epitaxy (SSMBE), and chemical beam epitaxy.

In one embodiment, the substrate may comprise GaAs, and the substrate protective layers and device structure protective layers may be lattice matched compounds, such as GaAs, AlInP, GaInP, AlGaAs, GaPSb, AlPSb and combinations thereof. In another embodiment, the substrate may comprise GaAs and the substrate protective layers and device structure protective layers may be strained layers, such as InP, InGaAs, InAlAs, AlInP, GaInP, InAs, InSb, GaP, AlP, GaSb, AlSb and combinations thereof, including combinations with lattice matched compounds.

Examples of suitable III-V materials for the one or more protective layers include, but are not limited to, AlInP, GaInP, AlGaAs, GaPSb, AlPSb, InP, InGaAs, InAs, InSb, GaP, AlP, GaSb, AlSb, InAlAs, GaAsSb, AlAsSb, and GaAs. In some embodiments, when the growth substrate is GaAs, the one or more protective layers are chosen from lattice matched AlInP, GaInP, AlGaAs, GaPSb, AlPSb, and strained InP, InGaAs, AlInP, GaInP, InAs, InSb, GaP, AlP, GaSb, AlSb. In some embodiments, when the growth substrate is InP, the one or more protective layers are chosen from lattice matched InGaAs, InAlAs, GaAsSb, AlAsSb, and strained InGaAs, InAlAs, GaAsSb, AlAsSb, InAs, GaSb, AlSb, GaAs, GaP and AlP. U.S. Pat. No. 8,378,385 and U.S. Patent Publication No. 2013/0043214 are incorporated herein by reference for their disclosure of protective layer schemes.

The protection layer may further comprise one or more protective layers, as described. In some embodiments, the protection layer further comprises one protective layer. In other embodiments, the protection layer further comprises two protective layers. In other embodiments, the protection layer further comprises three or more protective layers. The protective layer(s) may be positioned between the growth substrate and the sacrificial layer.

A sacrificial release layer is then grown onto the protection layers. One non-limiting example of such a layer is AlAs. When using this material as a sacrificial layer, arsenic oxide buildup can slow the AlAs etch during lift-off. Thus, by cladding the AlAs with a slowly etched III-V material (e.g. InAlP, AlGaAs, InAlGaP) the arsenic oxide buildup can be reduced; thus, expediting the lift-off process. U.S. Patent Publication No. 2010/0047959, which is incorporated herein by reference, describes a method for selectively freeing an epitaxial layer from a single crystal substrate.

In one embodiment, the active thin-film device region can be lifted-off by selectively etching a sacrificial layer using a known acid. The sacrificial layer of the growth structure acts as a release layer during ELO for releasing the epilayer from the growth substrate. The sacrificial layer may be chosen to have a high etch selectivity relative to the epilayer and/or the growth substrate so as to minimize or eliminate the potential to damage the epilayer and/or growth substrate during ELO. It is also possible to use protective layers between the sacrificial layer and the epilayer to protect the epilayer during ELO. In some embodiments, the sacrificial layer comprises a III-V material. In some embodiments, the III-V material is chosen from AlAs, AlInP, and AlGaInP. In certain embodiments, the sacrificial layer comprises AlAs. In some embodiments, the sacrificial layer has a thickness in a range from about 2 nm to about 200 nm, such as from about 4 nm to about 100 nm, from about 4 nm to about 80 nm, or from about 4 nm to about 25 nm.

The step of releasing the sacrificial layer by etching may be combined with other techniques, for example, spalling. PCT Patent Application No. PCT/US14/52642 is incorporated herein by reference for its disclosure of releasing an epilayer via combination of etching and spalling.

Next, the epilayer (or active device region) is grown, typically in inverted order such that after bonding to the secondary plastic substrate, devices can be fabricated in their conventional orientation, thereby eliminating a second transfer step often employed in ELO device processing. The epilayer of the growth structure refers any number of layers desired to be "lifted off" of the growth substrate. The epilayer, for example, may comprise any number of active semiconductor layers for fabricating an electronic or optoelectronic device. Thus, the epilayer is sometimes referred to as a "active device region." The epilayer may comprise layers for fabricating devices including, but not limited to, photovoltaics, photodiodes, light-emitting diodes, and field effect transistors, such as metal-semiconductor field-effect-transistors and high-electron-mobility transistors. In some embodiments, the epilayer comprises at least one III-V material.

An example of a complete epi growth structure according to the present disclosure is shown in FIG. 1. As one skilled in the art would appreciate, the inverted GaAs solar cell structure in the figure can be substituted by other inverted high efficiency III-V semiconductor solar cells structure. With reference to FIG. 1, the rear surface mirror in this structure allows photons to be reflected back to the active absorption region to achieve double absorption, by which mean, the thickness of active region can be reduced to half comparing to single absorption device, while maintaining the same external quantum efficiency.

In one embodiment, after the substrate is bonded to the plastic substrate, the active device region may be lifted-off from the parent wafer by immersion etching, such as with an acid.

In another embodiment, Applicants have discovered a nondestructive two-step cleaning procedure to recover the original surface quality of the substrate wafer for wafer reuse. This procedure first comprises pre-cleaning the surface of the substrate by a dry etch step, such as by inductively coupled plasma to remove most of the contamination. Then the various protection layers are removed using acid-based etchant until the etching stops at the etch stop layer. The etch stop layer is then removed using a string acid (e.g., diluted HCl acid (HCl:H$_2$O (1:1) for the etch stop layer versus a phosphoric acid etchant for the protection layers). Ultimately, complete etching is achieved, allowing this last step of surface cleaning to provide a high quality regrowth interface. As shown in the Atomic Force Microscope (AFM) images of FIG. 2, the GaAs parent wafer substrate surface shows changes to the root-mean square (RMS) surface roughness after each step, thereby providing evidence of the efficacy of this nondestructive two-step cleaning procedure.

In one embodiment, the photovoltaic cell comprises an active photovoltaic region comprising a flexible crystalline semiconducting cell. Non-limiting examples of the single junction semiconducting cell includes InGaP, GaAs, InGaAs, InP, or InAlP. The flexible crystalline semiconducting cell typically has a thickness ranging from 2 to 10 μm, such as from 3-6 μm.

In another embodiment, the photovoltaic cell comprising an active photovoltaic region comprising multi-junctions cells, such as tandem photovoltaic (with two sub-cells), triple junction cells (three sub-cells), or even quad junction cells (four sub-cells).

In one embodiment, a very high-efficiency multi-junction (GaAs/InGaP) solar cell can be sued. The design for this embodiment can be inverted relative to a conventional multi-junction cell growth sequence to accommodate the "upside down" bonding geometry used in the adhesive-free cold-weld process; the structure includes a 25% GaAs cell architecture. In this case, the GaAs cell thickness can be reduced (such as to 2 μm, which is approximately 50% of the conventional substrate-based cell) since the reflective, full-coverage ohmic contact allows for two passes of the incident light through the device active region. The primary focus will be on optimizing the tandem PV structure for maximum efficiency, including InGaP cell design (layer thickness, window layer, layer composition, etc.), improving the wide-gap tunnel junctions (TJ) between elements in the stack, and perfecting the multiple lift-off process over large areas for this multi-junction cell.

Solar cells will be grown with n-type material on top of p-type layers, whereas the tunnel junctions must be grown with the opposite polarity. The cells may employ carbon-doping in all or several of the p-type layers, since carbon does not readily migrate to the growth surface as does the conventional p-dopant, Be. As the tandem cells are generally limited by the current in the GaAs cell, the InGaP cell thickness needs to be adjusted to current-match the InGaP and GaAs cells.

After the photovoltaic cell is formed, it is coated with a conductive metal coating on one surface. Non-limiting examples of the metal coating includes at least one metal chosen from Au, Ag, Pt, Pd, Ni, and Cu, with a particular emphasis on Au. In one embodiment, the Au layer on the support substrate has a thickness ranging from 100-500 μm, such as from 200-400 μm.

Once the photovoltaic cell is removed from the growth substrate by the non-destruction ELO process described above, it is mounted on the support structure by various bonding process. For example, the active photovoltaic region, whether single junction or multi-junction cells, may be applied to the host substrate by a direct-attachment bonding process. This process comprises adding metal layers to adjoining surfaces of the active region and the flexible host substrate and using cold-welding to bond them. Cold-weld bonding processes typically include pressing two surfaces together at room temperature to achieve a uniformly bonded interface.

As in the case of the single junction cells, the multi-junction cell can be microscopically and chemically examined after each iteration of the growth-ELO-reuse cycle. Completed cells, including anti-reflection coating, can be electrically tested using standard illumination conditions (AM1.5G spectrum), but over a range of intensities up to 10 suns. Parameters to be measured include PCE, fill factor, open circuit voltage, short circuit current, series and parallel resistance, as in the case of the single junction cells.

Alternative direct-attachment bonding processes may include thermo-compression bonding, which typically involves the application of a lower pressure but at a high temperature (i.e., higher than the metal re-crystallization temperature). This process is typically not used when the flexible substrate has a glass transition and/or a melting temperature below the re-crystallization temperature of metal layers used in direct-attachment bonding processes.

Another direct-attachment technique for bonding metal layers associated with an ELO process that may be used is a thermally-assisted cold-weld bonding process using a lower pressure than typical cold-welding processes and a lower temperature than typical thermo-compression bonding processes. Particularly, thermally-assisted cold-welding may reduce the likelihood of damaging semiconductor wafers, thereby increasing the reuse rate of the wafers for growing additional active regions.

Non-limiting examples of the direct-attachment bonding processes that can be used herein include cold-welding, thermally assisted cold-welding, or thermo-compression bonding. U.S. Patent Application Publication No. US 2013/0037095, which describes cold-welding, is incorporated herein by reference.

Additional cost reduction may be possible by bonding to metal-foil substrates such as Au-coated Cu foils, use of less expensive metals for cold-welding (e.g. Ag instead of Au), reduced consumption of HF, reduced protection layer thicknesses, and accelerating the lift-off process. The extended exposure to HF used to dissolve the AlAs sacrificial layer limits the choice of metal host substrates that can be employed. In one embodiment, Cu foils, which can be used for cold-welding, are used to increase resistance upon exposure to HF, as their use may be simpler than coating the foil with a noble metal such as Au. An additional benefit to using Cu foil is its high thermal conductivity (~4 W cm$^{-1 \circ}$ C.$^{-1}$) that can be exploited to extract heat from the concentrated cells.

Solar Cell Strip Fabrication for Acceleration of ELO Process

To accelerate the ELO process described herein, Applicants have employed an etching step. In particular, Applicants have discovered that when patterns are etched into the epitaxial layers down to the AlAs sacrificial layer, the time to achieve ELO is significantly improved. In one embodiment, Applicants have shown that if parallel trenches are formed down to the sacrificial layer using reactive ion etching through a metal mask pattern, after the photoactive cell is formed, and prior to the cold-weld bonding process previously described, the ELO process is accelerated. In particular, the lift-off etch time is significantly reduced using this modified ND-ELO process, since it does not require full wafer etching. Instead, etchant can enter the trenches between narrow stripes to etch AlAs sacrificial layer, and the process can be ~5× to 10× faster than the full wafer etching depending on the strip width.

Figure 3:
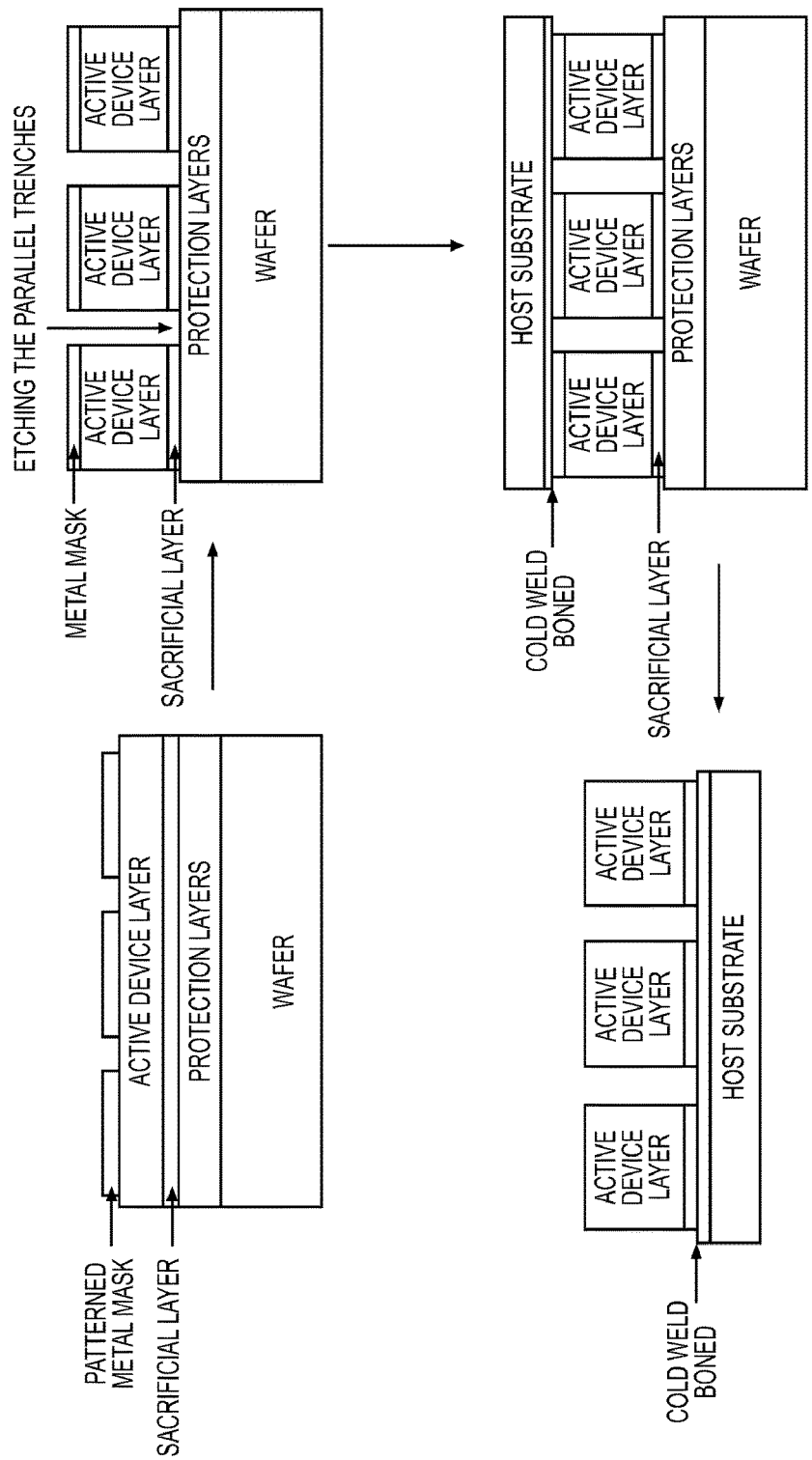
FIG. 3. is a fabrication flow chart for thin-film GaAs solar stripes on host substrate.

FIG. 3 shows the fabrication procedure for ELO processed solar cell stripes. Strip shape thin-film solar cells are employed to be conveniently integrated with single axis tracking 2-dimensional parabolic concentrator, which concentrates light collected over large areas to devices of smaller area. It focuses incident parallel sun rays to a spot or a line via mirrors or lenses. Moreover, this process can be modified to be compatible with double axis tracking 3-dimensional parabolic concentrator by employing various shape solar cells (such as circular, rectangular and hexagonal etc.).

Parabolic Concentrator Fabrication

A traditional compound parabolic collector (CPC) can only provide a limited concentration factor of around 4×-10× depending on the designed acceptance angle of CPC. In addition, these collectors require a high aspect ratio which is hard to be fabricated with plastic deformation technique using vacuum mold.

To achieve the high concentration factor with low aspect ratio, in one embodiment, a parabolic concentrator array design was employed instead of CPC. Concentration factor can be adjusted by modifying the ratio between opening area of parabolic concentrator and solar cell stripe area.

To fabricate the parabolic concentrator array, deformable medium (e.g. polymer) can be molded to cylindrical paraboloids mini-concentrator using a vacuum mold and oven. Instead of strip shape thin-film solar cells, stripe shape Si or Poly-Si solar cell can also be employed to be conveniently integrated with single axis tracking 2-dimensional parabolic concentrator. The design of concentrator is the same with conventional parabolic concentrators, but it is made by an inexpensive plastic. Because it is a scaled down version compared with conventional large concentrator. As these designs are 2D shape, they just need to track for single axis.

In one embodiment, to fabricate such concentrators, a polyethylene terephthalate glycol-modified (PETG) sheet is fixed with Kapton® tape across the top of a metal mold containing holes at its base. A 0.75 mm thick PETG sheet is employed for the concentrators due to its low glass transition temperature (81° C.), making it possible to shape by simultaneously applying heat and vacuum. While vacuum is applied through the holes, the assembly is placed in an oven at 60° C. The PETG is drawn into the mold as the oven temperature is raised to 96° C. for ~15 min, forming the compound parabolic shape. The concentrator is then cooled, after which concentrator is detached from the metal mold.

Figure 4A:
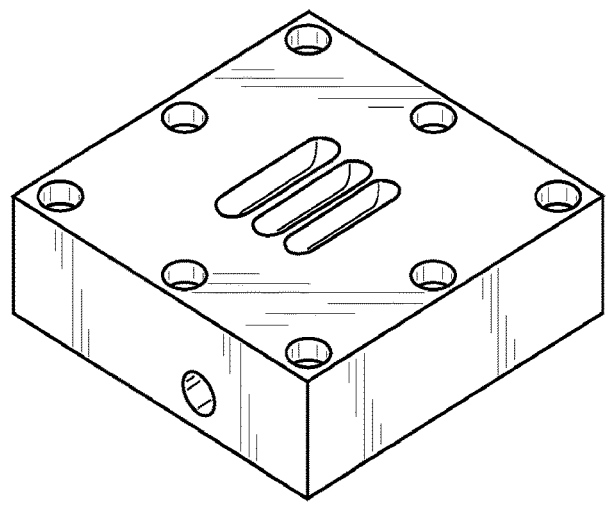
FIG. 4(a) is a schematic illustration of vacuum mold and FIG. 4(b) is a picture of fabricated vacuum mold for parabolic concentrator fabrication.
Figure 4B:
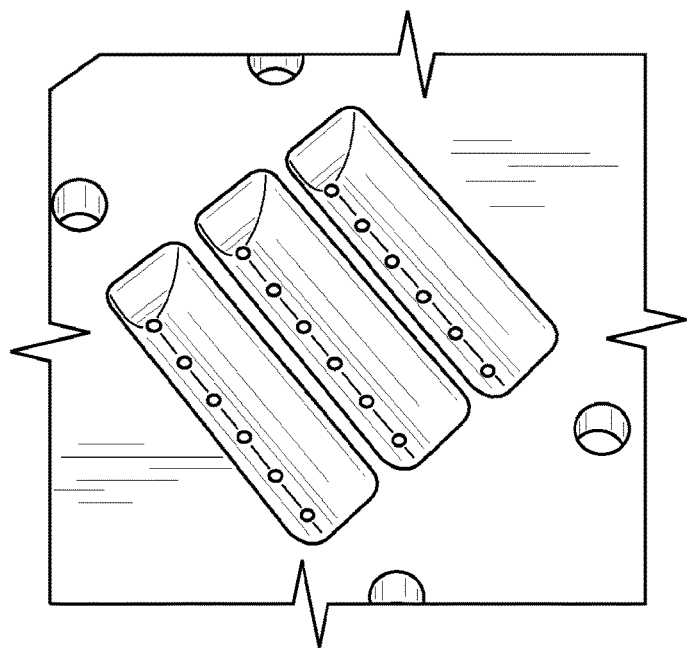
Figure 5A:
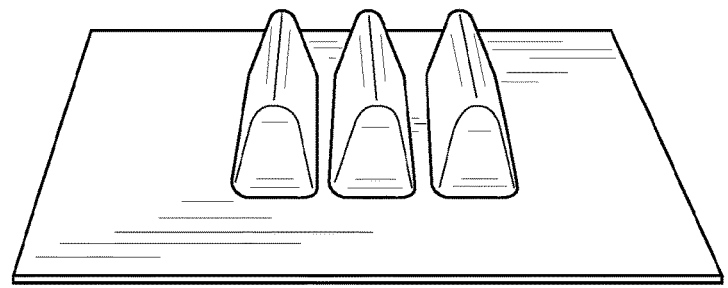
FIG. 5 is a picture of (a) deformed plastic using vacuum mold and (b) metalized plastic host platform coated with highly reflective material (Ag) for the maximum light reflection.
Figure 5B:
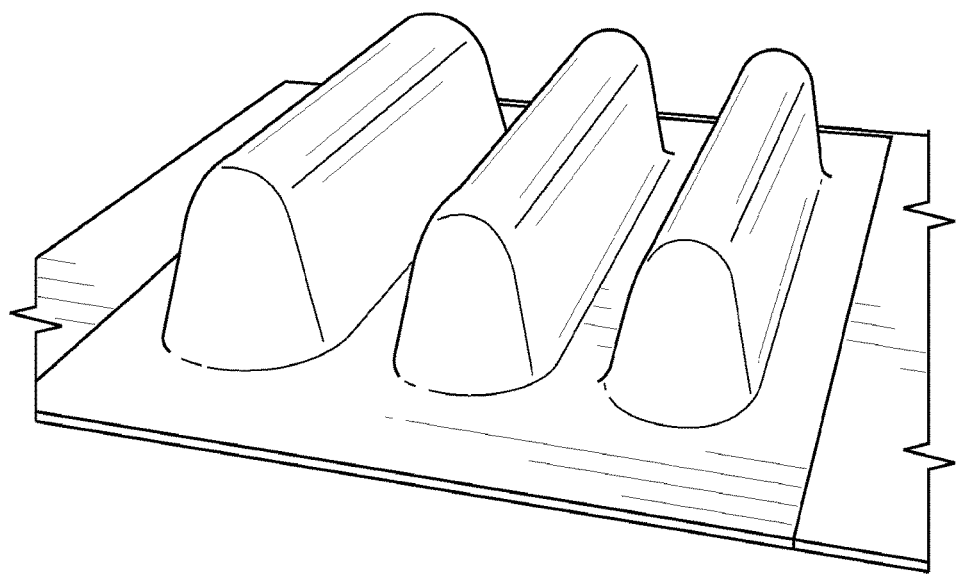

FIGS. 4(a) and (b) show schematic and picture of vacuum mold, and FIG. 5(a) shows deformed plastic into the same shape of vacuum mold. Then, a highly reflective metal lattice, such as Ag, can be deposited onto the surface of a cylindrical paraboloids mini-concentrator. This embodiment is shown in FIG. 5(b). A contact pad for cathode and anode can also be patterned on the edge of this surface for the later device integration.

The entire molded array of this embodiment can be extremely lightweight (as it can be made entirely comprised of plastic and thin metal films) and have some limited flexibility when complete. With the reflective surface facing up, the concentrator is designed such that the line of focal point is located right at the center of the concentrator opening plane, which allows the full collection of light incident into the cylindrical paraboloids mini-concentrator.

The flexible material comprises, in an embodiment, a plastic material, such as a polyimide, or metal foil. The support structure typically has a thickness ranging from 25 to 100 µm, such as 40 to 60 µm.

When the flexible material comprises a plastic material, it typically has a conductive metal coating on one surface. Non-limiting examples of the metal coating includes at least one metal chosen from Au, Ag, Pt, Pd, Ni, and Cu, with a particular emphasis on Au. In one embodiment, the Au layer on the support substrate has a thickness ranging from 100-500 µm, such as from 200-400 µm.

Integration of Thin-Film Solar Cells with Concentrator

Figure 6A:
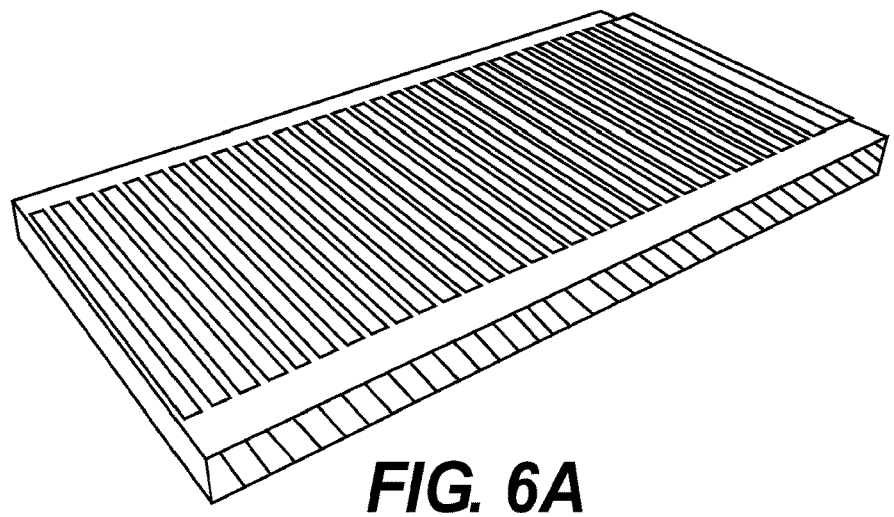
FIG. 6 is a schematic illustration of (a) thin-film lifted off solar cell stripes bonded on elastomeric stamp and (b) the elastomeric stamp stretched and wrapped around a cylinder ready for the following integration process.

In one embodiment, an elastomeric stamp, such as a polymeric organosilicon, e.g., polydimethylsiloxane (PDMS), can be made using the methods previously described herein. For example, an elastomeric stamp can be made that has been metalized and cold-weld bonded to the epitaxial and metalized surface with parallel raised stripes, which have been etched down to the AlAs sacrificial layer. The modified ELO process described above can then be used to form thin-film solar cell stripes array on this elastomeric stamp. This embodiment is shown in FIG. 6(a). Next, the upper surface of the solar cells is patterned and metalized to allow for illumination and contact from that surface. A contact pad for a cathode and an anode is then patterned onto the surface, which the array of solar cells is cold-weld bonded for the later device integration.

Figure 6B:
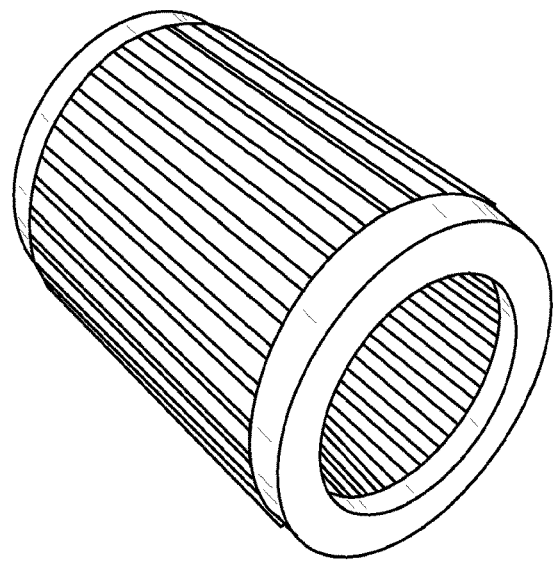

The elastomer is then stretched to approximately double its length and wrapped around a cylinder. This embodiment is shown in FIG. 6(b). Finally, the cylindrical paraboloids mini-concentrator array are mounted to a linear transfer stage, and the cylinder is pressed against the cylindrical paraboloids mini-concentrator array (FIG. 7) to finish the integration.

A linear transfer stage is a stage that can hold the cylindrical paraboloids mini-concentrator array. In one embodiment, this stage can move along the cylinder's rolling direction at a controlled speed as shown in FIG. 7.

Figure 7:
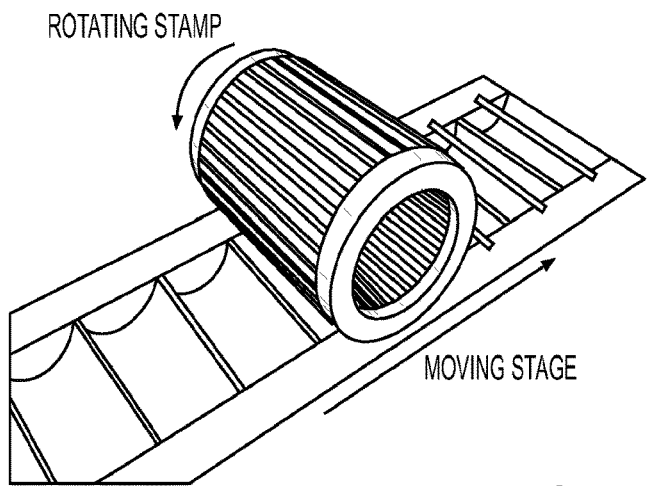
FIG. 7 is a schematic illustration of elastomeric stamp pressing against the concentrator array.

As shown in FIG. 7, the contact pads for cathode and anode on both concentrator array and solar cell bonded surface are aligned and attached to each other under precise control of rotating speed of elastomeric stamp and transferring speed of concentrator array.

The edge of the strip shape solar cell is then pressed against the flat surface on the side of the cylindrical paraboloids mini-concentrator array. The solar cell and mini-concentrator array are bonded through cold welding by applying mechanical pressure.

Figure 8:
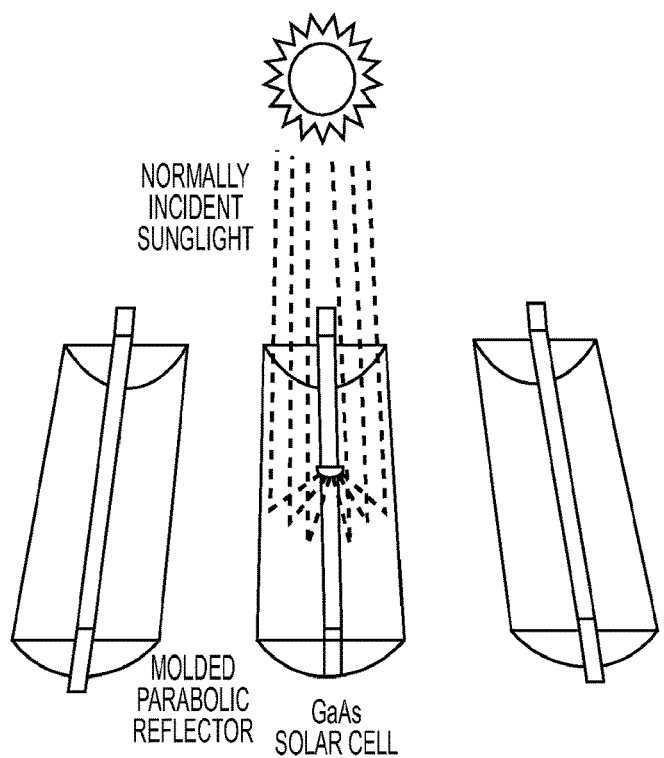
FIG. 8 is a schematic illustration of solar cell stripes integrated with mini-concentrator array.

The resulting solar cell stripes integrated with mini-concentrator array is shown in FIG. 8. This integrated device is able to collect the entire normally incident light into the cylindrical paraboloids miniconcentrator and focusing them onto the solar cell stripes. The concentration factor of each individual concentrator is the ratio between opening area of parabolic concentrator and solar cell stripe area.

Thin-film multi-junction cells bonded onto reflective and flexible substrates provide a unique opportunity to integrate the solar collector with the thin-film cell without introducing significant additional costs. In one embodiment, there is disclosed a strip consisting of the ELO single cell or multi-junction cell that is bonded to the center of a larger, flexible, reflective film. The film is then molded (by placement in a thermally conductive or actively cooled preform) into the shape of a compound parabolic collector (e.g. a CPC, or Winston collector). This geometry concentrates parallel solar rays onto the cell strip at its focus, as well as collects diffuse light within the acceptance cone.

Additional benefits to the small concentrations used include the allowed use of single-axis tracking (daily or seasonally, depending on orientation of the collector), and simplified passive cooling than are needed for higher concentrations. Indeed, the very thin substrates used greatly simplify heat transfer: calculations indicate that at 10× concentration and a 25 mm thick Kapton™ substrate placed against a passively cooled Cu heat sink results in a temperature rise of only 5-20° C., obviating the need for more aggressive cooling methods.

In one embodiment, there is disclosed a method of preparing a photovoltaic device structure comprising: providing a growth substrate; depositing at least one protection layer on the growth substrate; depositing at least one sacrificial layer on the protection layer; depositing at least one photoactive cell on the sacrificial layer; etching a pattern of at least two parallel trenches that extend from the at least one photoactive cell to the sacrificial layer, wherein said etching causes the surface of the structure to form alternating trenches that extend to the sacrificial layer and plateaus that comprise the photoactive cells.

The disclosed method may further comprise depositing at least one metal on the at least one photoactive cell and bonding the photoactive cells located on the plateaus to a host substrate. Non-limiting examples of the methods used to bond these surfaces include a direct attachment method selected from cold-welding, thermally assisted cold-welding, or thermo-compression bonding.

In one embodiment, the host substrate comprises an elastomeric material, such as polydimethylsiloxane (PDMS) that has been metalized with at least one metal chosen from Au, Ag, Pt, Pd, Ni, and Cu.

As previously described, the elastomeric material may be rolled into a circular stamp to expose the plateaus comprising parallel raised stripes of photoactive cells, which have been etched down to the sacrificial layer. The elastomeric material may be stretched to up to twice its size prior to being rolled into a circular stamp.

The disclosed method further comprises etching away the sacrificial layer to form a thin-film solar cell stripe array on said circular stamp. Non-limiting examples of the etching method includes contacting the sacrificial layer with a wet etchant, a dry etchant, or combinations thereof.

For example, the wet etchant may comprise HF, $H_3PO_4$, HCl, $H_2SO_4$, $H_2O_2$, $HNO_3$, $C_6H_8O_7$, and combinations thereof, including combinations with $H_2O$. The dry etchant may comprise reactive ion etching (RIE) with a plasma.

The method may further comprise additional processing steps performed on the surface of the photoactive cell chosen from patterning, metalizing, and combinations. The processing steps are known in the photolithography art.

In one embodiment, the method further comprises mounting at least one cylindrical paraboloid mini-concentrator array to a linear transfer stage. The cylindrical paraboloid mini-concentrator array typically comprises a plastic material, such as an amide that can molded under vacuum and heat to form cylindrical paraboloids mini-concentrator arrays. Alternatively, the cylindrical paraboloid mini-concentrator array may comprise a flexible metal. Whether a plastic or metal, the cylindrical paraboloid mini-concentrator array may have a thickness ranging from 10 to 250 µm, such as 15 to 200 µm, or 20 to 150 µm, or even 25 to 100 µm.

Furthermore, whether the cylindrical paraboloid mini-concentrator array is a plastic or a metal, it can be metalized with at least one metal selected from Au, Ag, Pt, Pd, Ni, and Cu.

To assist in integrating solar cells into the concentrator array, the mini-concentrator array and solar cells can each comprise contact pads for the cathode and anode, wherein the contact pads are aligned and attached to each other under control of rotating speed of the elastomeric stamp and transferring speed of concentrator array.

Once the rotating speeds of the elastomeric stamp and transferring speed of concentrator array are aligned, the method next involves bonding the at least one photoactive cell located on the circular stamp to the cylindrical paraboloids mini-concentrator array to form an integrated, solar cell array.

The resulting cylindrical paraboloids mini-concentrator array has a parabolic trough design, which comprises a linear parabolic reflector that concentrates light onto the photoactive cell positioned along the focal line of the reflector. In one embodiment, the photoactive cell and the linear parabolic reflector have the same radius of curvature to minimize reflection losses.

ELO of Thin-Film Strips

There are a variety of difficulties encountered in epitaxial lift-off (ELO), which the processes described in the present disclosure solves. For example, ELO is often a slow process that has been shown to take very long times (currently 6 hrs-10 days per 2" wafer). The longer a wafer sits in the lift-off etchant (such as HF), the more surface oxidation occurs (i.e. arsenic oxides) that is difficult to remove. Thus, by shortening the epitaxial lift-off time, the wafer surface is prevented from excessive damage. Commercialization will likely use larger wafers and the ELO times will increase roughly linearly with wafer diameter. ELO could present a bottleneck in a production setting.

Figure 9:
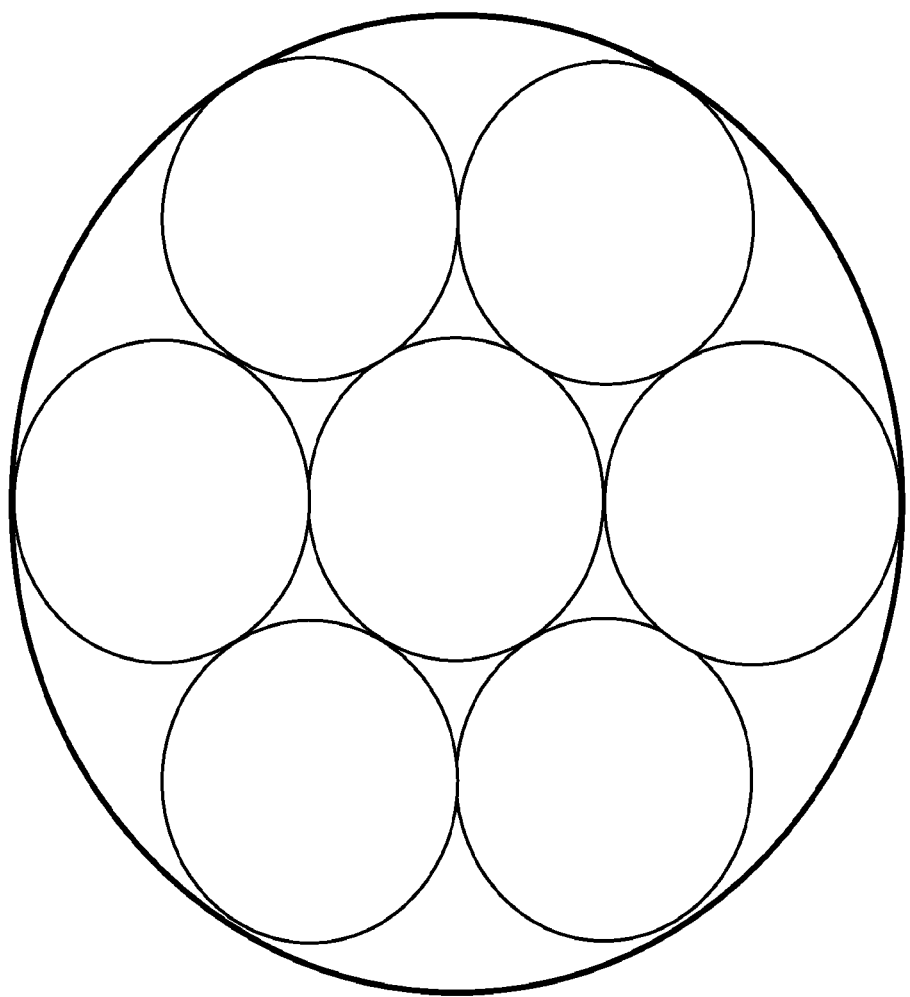
FIG. 9 is a schematic showing how seven (7) wafers can be tiled into a round susceptor that results in approximately 77% packing factor.

In addition, source material utilization is ultimately related to the area covered by wafers in a platen in the growth area of a given reactor (i.e. MOCVD or MBE) and is typically are limited by the packing of circles on the platen of a given size. The upper limit of this efficiency is 90.7% (i.e. π/12), the maximum packing fraction for circles), but practical values of 75% are more likely as wafers generally do not touch in the reactor and edge effects must be accounted for. For example, a round susceptor that fits seven round wafers tiled in a hexagonal array will fill about 77% of the susceptor area, as shown in FIG. 9. A second example is to pack 19 wafers into around susceptor resulting in 76% filling fraction. Note that there are generally other materials use losses encountered in deposition techniques.

Round wafers are an awkward shape for fabricating solar panel arrays because either part of the wafer needs to be discarded to produce square tiles that can fill the area of a panel efficiently, full wafers may be used to maximize materials utilization, or a compromise of partially truncating wafer edges (resulting in squares with rounded corners) may be used to balance optimization of wafer utilization and panel efficiency. Large wafers are fragile and present a higher risk under breakage than small wafers or parts of wafers.

The reduced width of the strips would drastically enhance lift off speed. The strips will be inherently less prone to breakage (resulting from their smaller size and mass) and will represent a smaller risk as a single broken strip is significantly less expensive than an entire wafer.

Another optimal geometry that differs from strips is squares. In one embodiment, 2" squares were placed together to fill a platen, and led to 5 hrs etching time. Yet, when complete, the squares were close packed onto the foil substrate to form an efficient module array. In this case, no concentration was needed or used.

In one embodiment there is described a method of preparing a photovoltaic device that incorporates a combination of the foregoing processes. For example, the method of preparing a photovoltaic device may comprise providing a substrate, such as a wafer; cleaving the substrate into a plurality of segments; depositing a plurality of thin film layers onto the substrate; and releasing the substrate from at least one of the thin film layers using the epitaxial lift-off process described herein.

Figure 10:
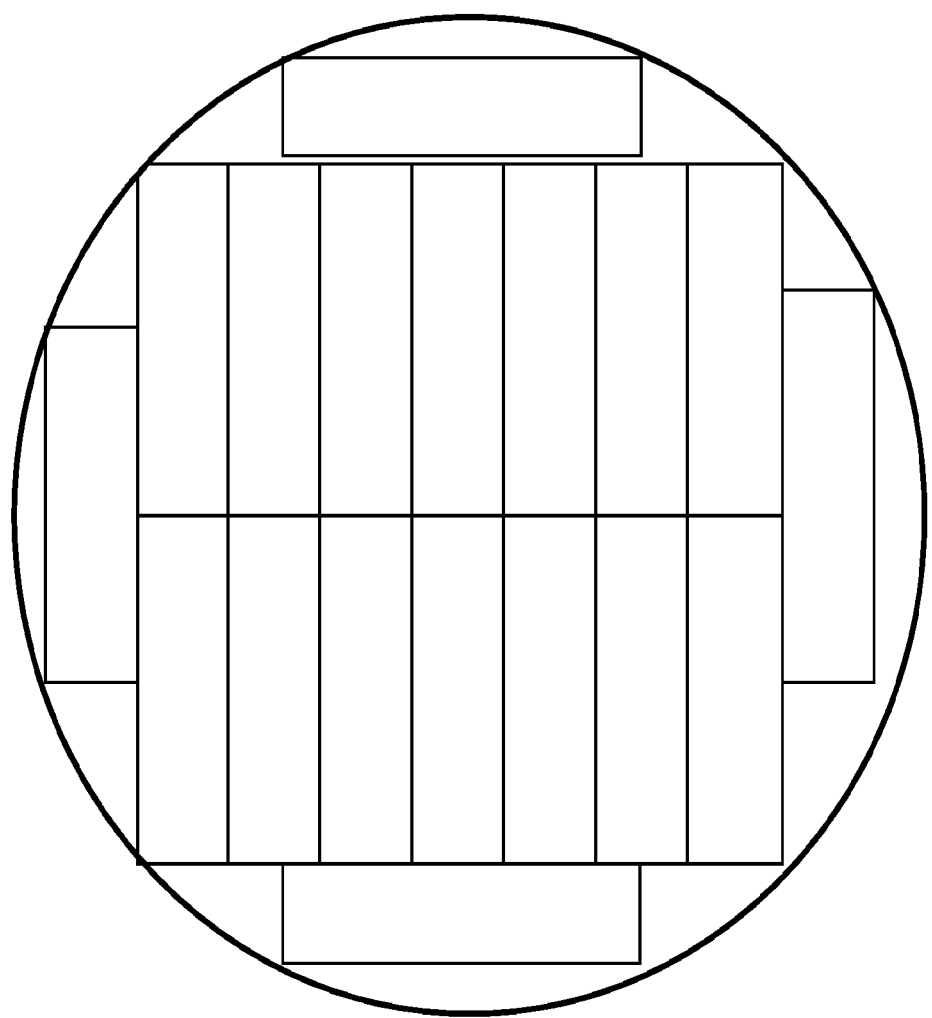
FIG. 10 is a schematic showing how eighteen 1 cm×3.5 cm rectangles, could be cut from a single 100 mm (4 inch) wafer.

In one embodiment, the plurality of segments have a geometry selected from rectangles and squares, as shown in FIG. 10.

The system, devices and methods described herein will be further described by the following non-limiting examples, which are intended to be purely exemplary.

EXAMPLE

The following example demonstrates a completely non-destructive ELO (ND-ELO) process that eliminates wafer damage by employing surface protecting layers interposed between the wafer and the epitaxy. The structure shown in FIG. 1 was made, and the inventive process was used to demonstrate how the surface protecting layers could be removed, along with all the inherent surface damage, using chemically selective etchants combined with a plasma process.

In particular, the active thin-film device region is lifted-off by selectively etching the AlAs sacrificial layer using dilute hydrofluoric acid. Details of the epitaxial layers, including the alternating GaAs—InGaP protection layers and the AlAs sacrificial layer are described in more detail below.

As shown in FIG. 1, the epitaxial structure consisted of sequential protection, sacrificial and active device layers. The lattice matched InGaP (100 nm) and GaAs (100 nm) protection and buffer layers were grown by gas source molecular beam epitaxy (GSMBE) on a 2 inch diameter (100) GaAs parent wafer An AlAs sacrificial release layer was then grown onto the protection layers. Next, the active device region was grown in inverted order such that after bonding to the secondary plastic substrate, the device could be fabricated in its conventional orientation, thereby eliminating a second transfer step often employed in ELO device processing.

The whole epi growth structure is shown in FIG. 1, although the inverted GaAs solar cell structure in the figure can be substituted by other inverted high efficiency III-V semiconductor solar cells structure. The rear surface mirror in this structure allowed photons to be reflected back to the active absorption region to achieve double absorption, by which mean, the thickness of active region could have been reduced to half comparing to single absorption device, while maintaining the same external quantum efficiency.

Once the GaAs substrate was bonded to the plastic substrate, the active device region was lifted-off from the parent wafer by immersion in HF for approximately 5 hrs. To recover the original surface quality of the substrate wafer for wafer reuse, the following completely nondestructive two-step cleaning procedure was developed and used.

First, the surface was pre-cleaned by inductively coupled plasma to remove most of the contamination. This cleaning procedure was applied to the lifted-off film as well as the substrate, which are similarly contaminated following the ELO process. Then, the underneath GaAs protection layer was removed using a phosphoric acid-based etchant ($H_3PO_4:H_2O_2:H_2O$ (3:1:25)) until the etching stops at the InGaP layer. Next, the InGaP layer was removed through etching in diluted HCl acid ($HCl:H_2O$ (1:1)), which provided complete etching selectivity with the GaAs growth buffer layer. The dilute HCl etch was well-known for preparing epi-ready surfaces through the removal of native oxides, allowing this last step of surface cleaning to provide a high quality regrowth interface.

Figure 2:
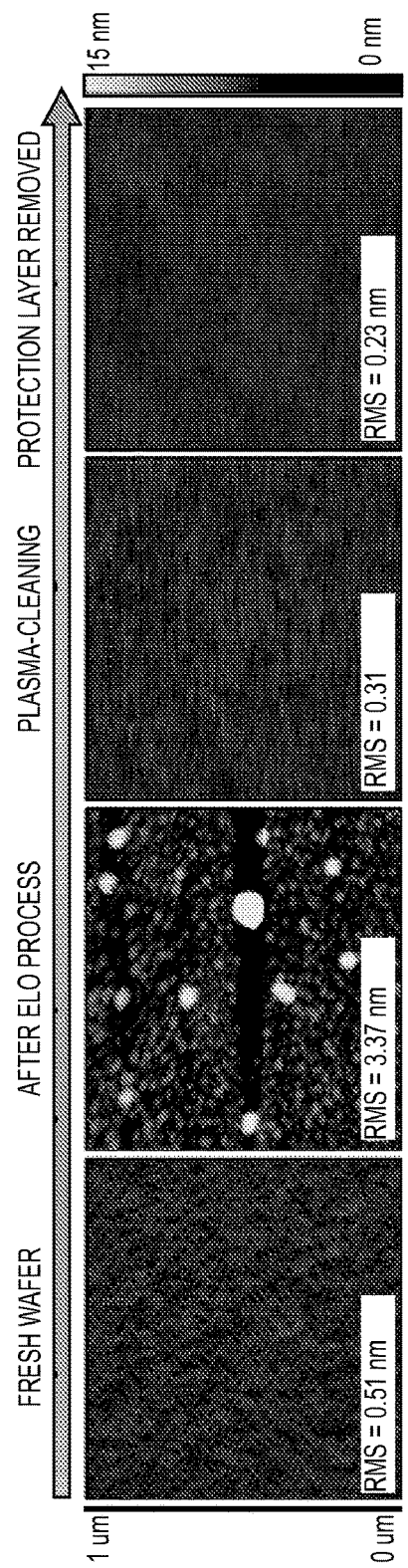
FIG. 2 is a comparison of wafer surface morphology before and after ELO.

The root mean square (RMS) surface roughness after each step is shown in FIG. 2, confirming recovery of the original surface morphology after cleaning. Then, the separated epitaxial films can be fabricated into solar cell. In particular, FIG. 2, are Atomic Force Microscope (AFM) images of the GaAs parent wafer substrate surface show the root-mean square (RMS) surface roughness (indicated by color bar) after each step. The growth started with sub-nanometer surface roughness. However, immediately following ELO by etching the sacrificial layer, the roughness increased by an order of magnitude. Plasma cleaning reduced surface roughness by removing particulates while minor physical damage was incurred by the underlying GaAs protection layer. Wet chemical cleaning was used to remove the remaining InGaP.

The description of the embodiments herein has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A non-destructive method for performing an epitaxial lift-off, comprising:
   providing a growth substrate;
   depositing at least one protection layer on the growth substrate;
   depositing at least one sacrificial layer on the protection layer;
   depositing a photoactive cell on the sacrificial layer;
   depositing a metal mask on the at least one photoactive cell;
   performing a first etch step through said metal mask to form a pattern in the photoactive cell, wherein said pattern extends to the sacrificial layer;
   bonding the photoactive cell to a host substrate comprising an elastomeric material; and
   removing the sacrificial layer with one or more second etch steps.

2. The method of claim 1, wherein the growth substrate comprises GaAs or InP.

3. The method of claim 1, wherein the at least one protection layer is lattice matched with the growth substrate.

4. The method of claim 3, wherein the at least one protection layer is selected from GaAs, InP, InGaAs, AlInP, GaInP, InAs, InSb, GaP, AlP, GaSb, AlSb, and combinations thereof.

5. The method of claim 4, wherein the at least one protection layer comprises at least three alternating layers of GaAs and InGaP.

6. The method of claim 1, wherein the at least one protection layer is deposited by at least one process chosen from gas source molecular beam epitaxy (GSMBE), metallo-organic chemical vapor deposition (MOCVD), hydride vapor phase epitaxy (HVPE), solid source molecular beam epitaxy (SSMBE), and chemical beam epitaxy.

7. The method of claim 1, wherein the at least one protection layer comprises a buffer layer, an etch-stop layer, or combinations thereof.

8. The method of claim 1, wherein the one or more second etch steps comprise contacting the sacrificial layer with a wet etchant, a dry etchant, or combinations thereof.

9. The method of claim 8, wherein said wet etchant comprises HF, $H_3PO_4$, HCl, $H_2SO_4$, $H_2O_2$, $HNO_3$, $C_6H_8O_7$, and combinations thereof, including combinations with $H_2O$.

10. The method of claim 8, wherein said dry etchant comprises reactive ion etching (RIE) with a plasma.

11. The method of claim 1, wherein said first etch step comprises reactive ion etching (RIE) with a plasma.

12. The method of claim 8, wherein the sacrificial layer comprises AlAs, and the one or more second etch steps comprise contacting said AlAs with HF.

13. The method of claim 1, wherein the etched pattern comprises two or more parallel trenches that have been etched in the at least one photoactive cell.

14. The method of claim 1, wherein the substrate comprises GaAs and wherein the protective layer scheme comprises GaAs Substrate /InAlP/InGaP/GaAs/InAlP/AlAs.

15. The method of claim 1, wherein the at least one photoactive cell comprises a single junction or multi-junction cell.

16. The method of claim 1, wherein said bonding comprises a direct attachment method selected from cold-welding, thermally assisted cold-welding, and thermo-compression bonding.

17. The method of claim 1, wherein said host substrate comprises an elastomeric material that has been metalized with at least one metal chosen from Au, Ag, Pt, Pd, Ni, and Cu.

18. The method of claim 1, wherein said elastomeric material comprises polydimethylsiloxane.

19. A growth structure for epitaxial lift-off, comprising:
a growth substrate;
at least one protection layer on the growth substrate;
at least one sacrificial layer on the protection layer;
at least one photoactive cell on the sacrificial layer;
at least one pattern that has been etched from the photoactive cell to the sacrificial layer, wherein the etched pattern comprises two or more parallel trenches; and
at least one metal disposed on the photoactive cell, wherein the at least one metal is bonded to a host substrate comprising an elastomeric material.

20. The growth structure of claim 19, wherein the growth substrate comprises GaAs and the at least one protective layer is selected from InP, InGaAs, AlInP, GaInP, InAs, InSb, GaP, AlP, GaSb, AlSb and combinations thereof.

21. The growth structure of claim 20, wherein the at least one protection layer comprises at least three alternating layers of GaAs and InGaP.

22. The growth structure of claim 19, wherein the sacrificial layer comprises AlAs.

23. The growth structure of claim 19, wherein the photoactive cell comprises active semiconductor layers for forming a photovoltaic device.

24. The growth structure of claim 19, wherein the at least one photoactive cell comprises a single junction or multi-junction cell.

25. The growth structure of claim 19, wherein the at least one protection layer comprises a buffer layer, an etch-stop layer, or combinations thereof.

26. The growth structure of claim 19, wherein the substrate comprises GaAs and wherein the protective layer scheme comprises GaAs Substrate /InAlP/InGaP/GaAs/InAlP/AlAs.

27. A method of preparing a photovoltaic device structure comprising:
providing a growth substrate;
depositing at least one protection layer on the growth substrate;
depositing at least one sacrificial layer on the protection layer;
depositing at least one photoactive cell on the sacrificial layer;
depositing at least one metal on the at least one photoactive cell;
etching a pattern of at least two parallel trenches that extend from the at least one photoactive cell to the sacrificial layer, wherein said etching causes the surface of the structure to form alternating trenches that extend to the sacrificial layer and plateaus that comprise said photoactive cells; and
bonding the photoactive cells located on the plateaus to a host substrate comprising an elastomeric material.

28. The method of claim 27, further comprising removing the at least one sacrificial layer with one or more etch steps to form a thin-film solar cell stripe array on the host substrate.

29. The method of claim 27, wherein said bonding comprises a direct attachment method selected from cold-welding, thermally assisted cold-welding, or thermo-compression bonding.

30. The method of claim 27, wherein said host substrate comprises an elastomeric material that has been metalized with at least one metal chosen from Au, Ag, Pt, Pd, Ni, and Cu.

31. The method of claim 30, wherein said elastomeric material comprises polydimethylsiloxane.

32. The method of claim 28, further comprising rolling the host substrate into a circular stamp to expose said plateaus comprising parallel raised stripes of photoactive cells.

33. The method of claim 32, wherein said elastomeric material is stretched to up to twice its size prior to being rolled into a circular stamp.

34. The method of claim 28, wherein the one or more etch steps comprises contacting the sacrificial layer with a wet etchant, a dry etchant, or combinations thereof.

35. The method of claim 34, wherein said wet etchant comprises HF, $H_3PO_4$, HCl, $H_2SO_4$, $H_2O_2$, $HNO_3$, $C_6H_8O_7$, and combinations thereof, including combinations with $H_2O$.

36. The method of claim 34, wherein said dry etchant comprises reactive ion etching (RIE) with a plasma.

37. The method of claim 27, further comprising additional processing steps performed on the surface of the photoactive cell chosen from patterning, metalizing, and combinations.

38. The method of claim 32, further comprising mounting at least one cylindrical paraboloid mini-concentrator array to a linear transfer stage.

39. The method of claim 38, wherein the mini-concentrator array and solar cells each comprise contact pads for the cathode and anode on both the concentrator array and solar cells, wherein said contact pads are aligned and attached to each other under control of rotating speed of the elastomeric stamp and transferring speed of concentrator array.

40. The method of claim 38, wherein said cylindrical paraboloid mini-concentrator arrays comprise a plastic material or flexible metal having a thickness ranging from 25 to 100 µm.

41. The method of claim 40, wherein said plastic material comprises an amide that is molded under vacuum and heat to form cylindrical paraboloids mini-concentrator arrays, wherein said amide is metalized with at least one metal selected from Au, Ag, Pt, Pd, Ni, and Cu.

42. The method of claim 38, further comprising bonding the at least one photoactive cell located on the circular stamp to the cylindrical paraboloids mini-concentrator array to form an integrated, solar cell array.

43. The method of claim 42, wherein the cylindrical paraboloids mini-concentrator array has a parabolic trough design.

44. The method of claim 43, wherein the parabolic trough comprises a linear parabolic reflector that concentrates light onto the photoactive cell positioned along the focal line of the reflector.

45. The method of claim 44, wherein the photoactive cell and the linear parabolic reflector have the same radius of curvature.

46. The method of claim 27, wherein the step of depositing at least one metal on the at least one photoactive cell comprises depositing a metal mask on said photoactive cell prior to etching a pattern, wherein said etching a pattern comprises reactive ion etching (RIE) with a plasma through said metal mask.

47. The method of claim 27, wherein the sacrificial layer comprises AlAs.

48. The method of claim 27, further comprising cleaving said substrate into a plurality of rectangular and/or square segments prior to depositing said at least one protection layer.

49. The method of claim 48, wherein said substrate comprises a wafer.

* * * * *